(12) United States Patent
Drane et al.

(10) Patent No.: US 8,943,447 B2
(45) Date of Patent: Jan. 27, 2015

(54) METHOD AND APPARATUS FOR SYNTHESISING A SUM OF ADDENDS OPERATION AND AN INTEGRATED CIRCUIT

(71) Applicant: Imagination Technologies Limited, Kings Langley (GB)

(72) Inventors: Theo Alan Drane, London (GB); Thomas Rose, Watford (GB)

(73) Assignee: Imagination Technologies, Limited, Kings Langley, Hertfordshire (GB)

( * ) Notice: Subject to any disclaimer, the term of this patent is extended or adjusted under 35 U.S.C. 154(b) by 0 days.

(21) Appl. No.: 13/921,471

(22) Filed: Jun. 19, 2013

(65) Prior Publication Data

US 2013/0346927 A1 Dec. 26, 2013

(30) Foreign Application Priority Data

Jun. 20, 2012 (GB) .................................. 1210982.3

(51) Int. Cl.
*G06F 9/45* (2006.01)
*G06F 17/50* (2006.01)
*G06F 9/455* (2006.01)
*G06F 7/523* (2006.01)
*G06F 7/499* (2006.01)
*G06F 7/509* (2006.01)
*G06F 7/533* (2006.01)

(52) U.S. Cl.
CPC ............ *G06F 7/523* (2013.01); *G06F 17/5045* (2013.01); *G06F 7/49947* (2013.01); *G06F 7/509* (2013.01); *G06F 7/5338* (2013.01)
USPC .......................................... 716/103; 716/104

(58) Field of Classification Search
USPC ................................................ 716/103, 104
See application file for complete search history.

(56) References Cited

U.S. PATENT DOCUMENTS

| 3,290,493 A | 12/1966 | Githens, Jr. et al. |
| 4,020,334 A | 4/1977 | Powell et al. |
| 5,038,312 A * | 8/1991 | Kojima .......................... 708/520 |
| 2007/0124562 A1 * | 5/2007 | Johnson et al. .................. 712/22 |

OTHER PUBLICATIONS

Comparative study on wordlength reduction and truncation for low power multipliers De La Guia Solaz et al, MIPRO 2010, May 24-28, 2010, Opatija, Croatia.
Design and application of faithfully rounded and truncated multipliers with combined deletion, reduction, truncation, and rounding Ko et al, IEEE Transactions on Circuits and Systems II:Express Briefs, vol. 58, No. 5, May 2011.

(Continued)

*Primary Examiner* — Suresh Memula
(74) *Attorney, Agent, or Firm* — Michael S. Garrabrants

(57) ABSTRACT

A method is provided for a synthesizing In RTL, a logic circuit and for manufacturing an integrated circuit for performing a sum of addends with faithful rounding. In this, optimization constraints for a value of bits which may be discarded and a constant to include in a sum of addends are determined (20). Next, the maximum number of whole columns that can be removed from the sum of addends array is derived (22) and those columns are discarded (24). Next, a number of bits which can be removed from the least significant column is derived (26) and these bits are discarded (28). The constant is included in the sum of addends and a logic array synthesized in RTL (31) before manufacturing an integrated circuit.

12 Claims, 8 Drawing Sheets

(56) References Cited

OTHER PUBLICATIONS

Design of fixed-width multipliers with linear compensation function, Petra et al, IEEE Transactions on Circuits And systems I: Regular Papers, vol. 58, No. 5, May 2011.

Search report in GB1210982.3.

Truncated binary multipliers with variable correction and minimum mean square error, Petra et al, IEEE Transactions Oncircuits and Systems I: Regular Papers, vol. 57, No. 6, Jun. 2010.

* cited by examiner

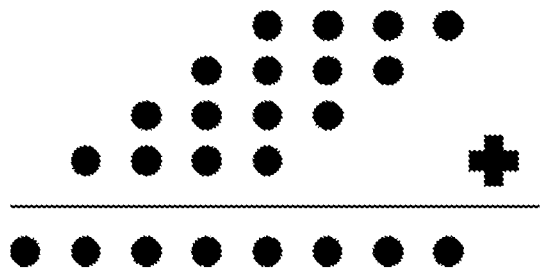
Figure 1 – Example summation of four 4-bit partial products
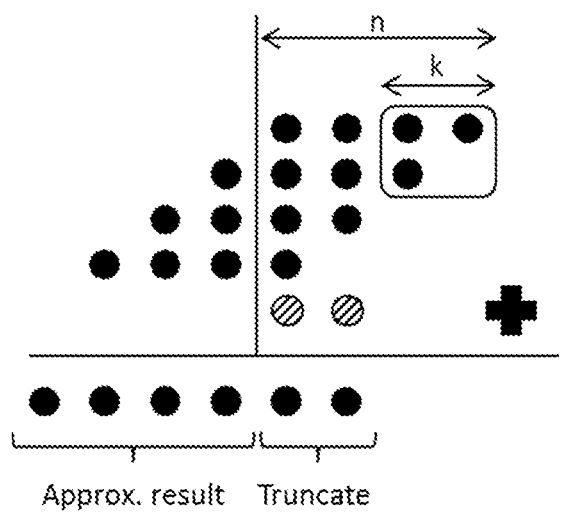
Figure 2 – Example truncated multiplier

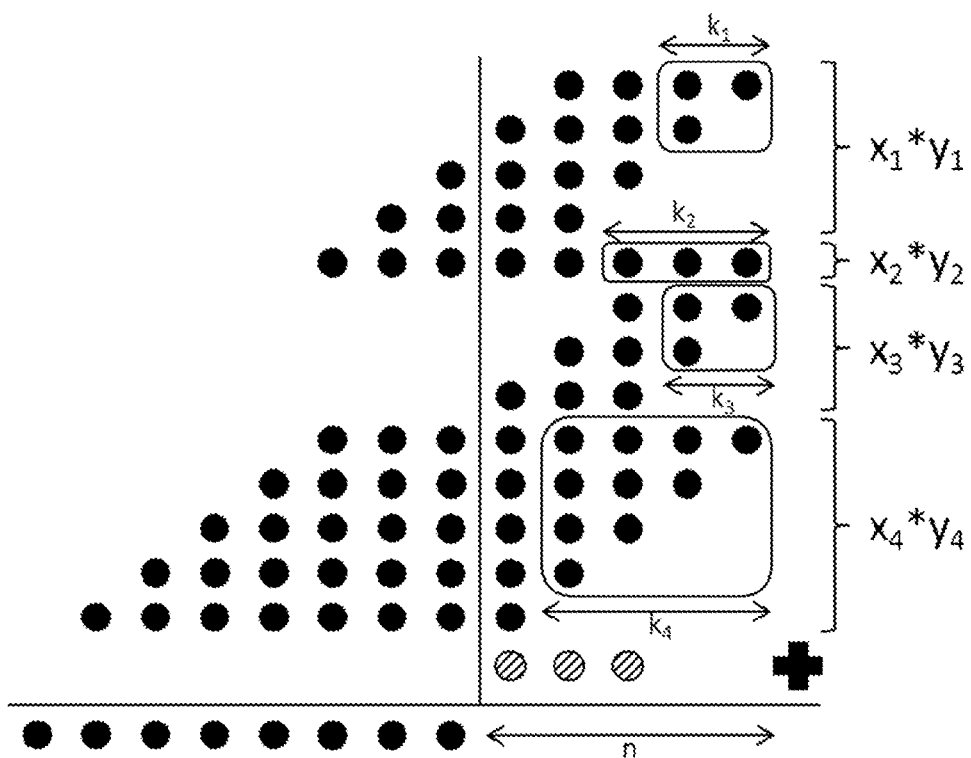
Figure 3 – Example combined truncated multipliers
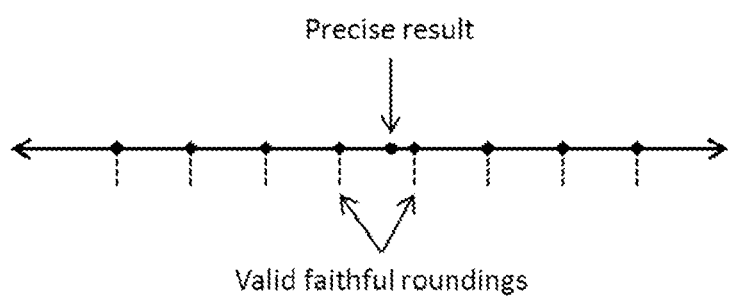
Figure 4 – Faithful rounding example

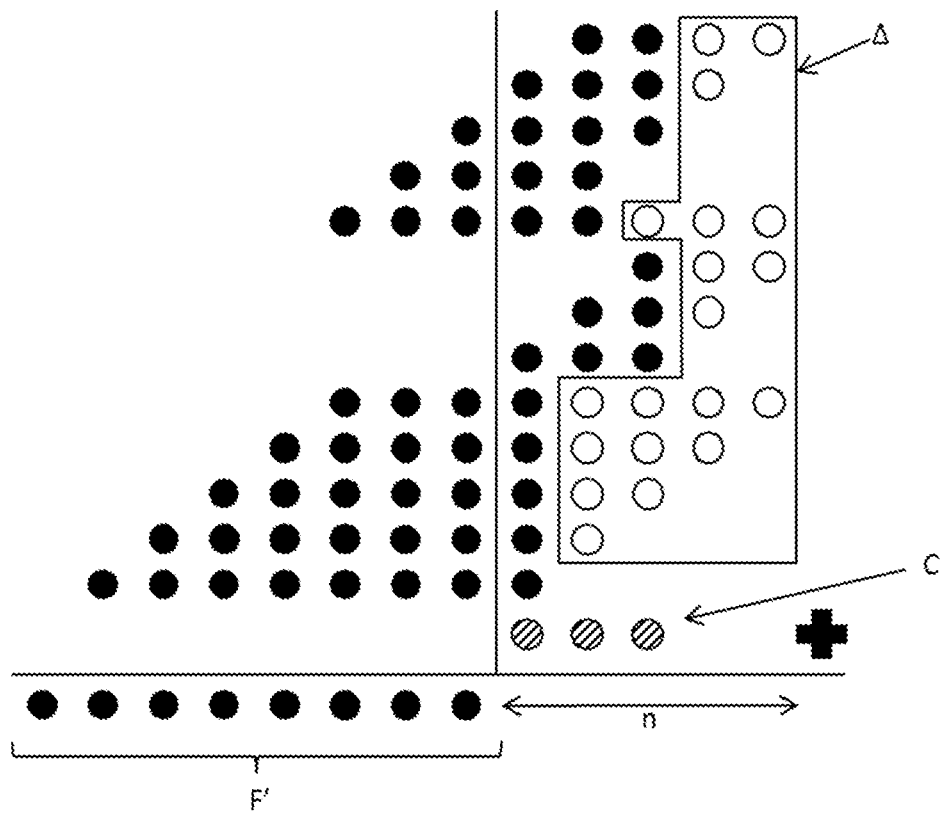
Figure 5 – Notation used to describe truncation

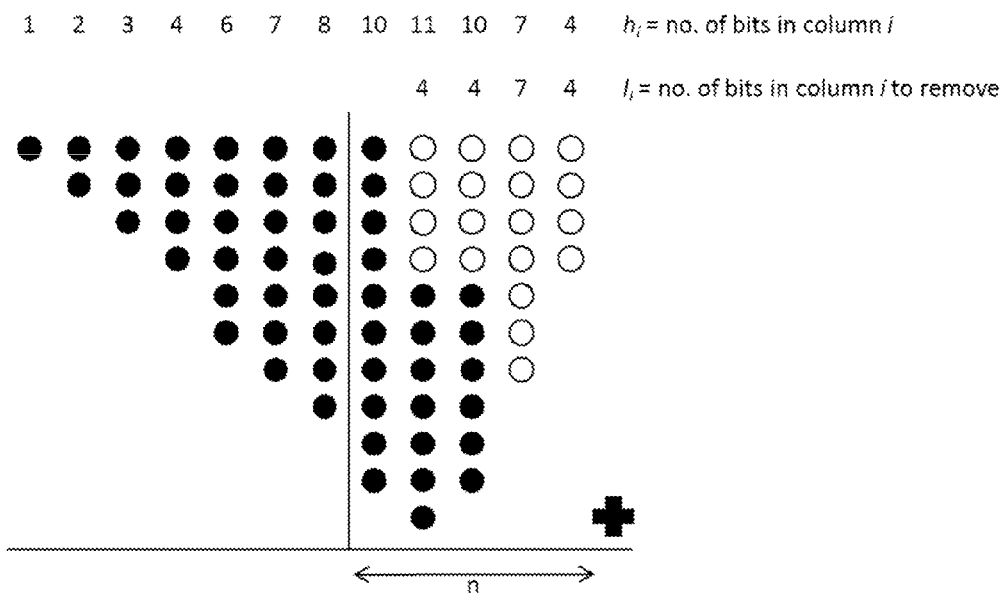
Figure 6 – Rearranged array from Figure 5
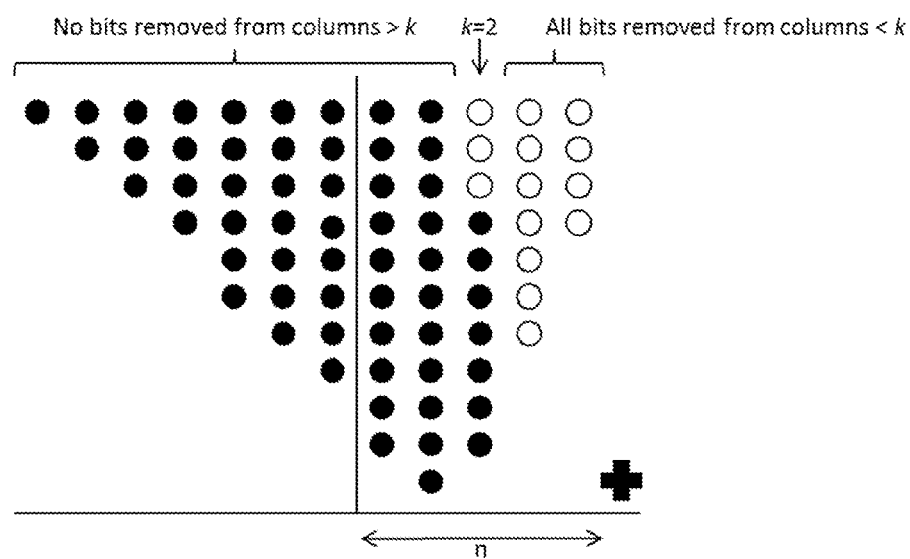
Figure 7 – Example calculation of optimal bits to truncate from arbitrary array

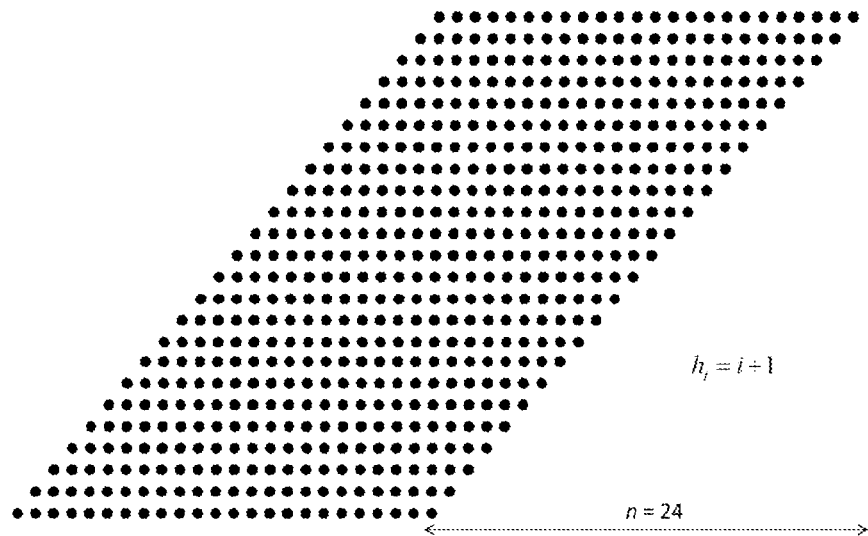
Figure 8 – Example 24-bit multiplication array
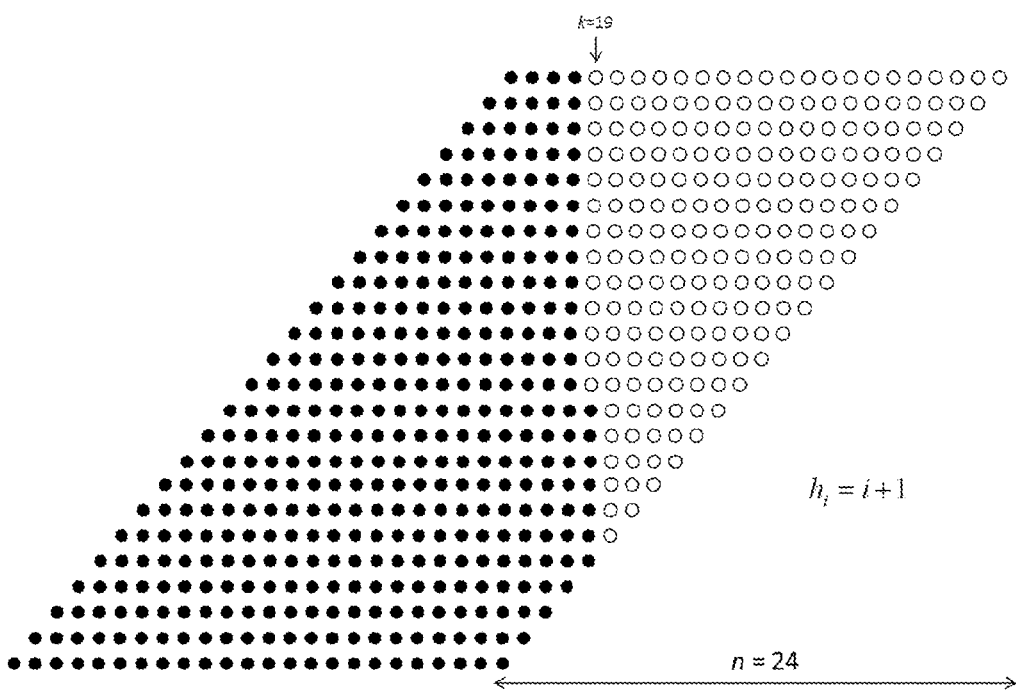
Figure 9 – Truncated example 24-bit multiplier array

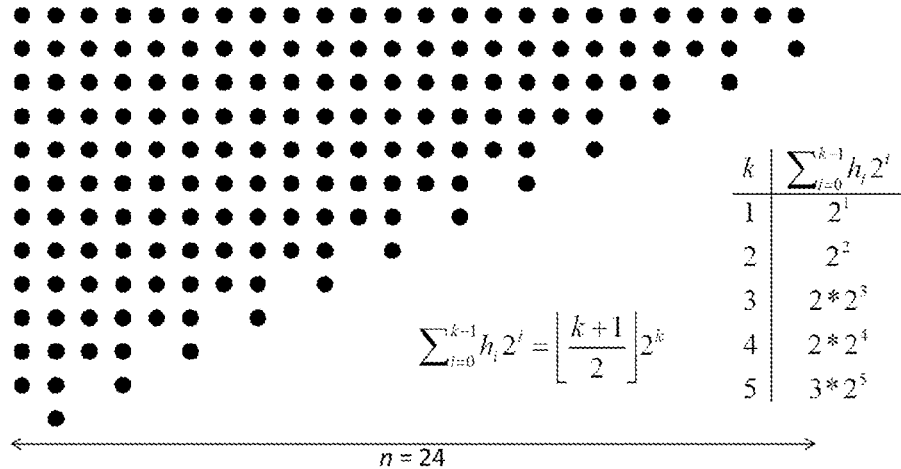
Figure 10 – Example Booth multiplier array
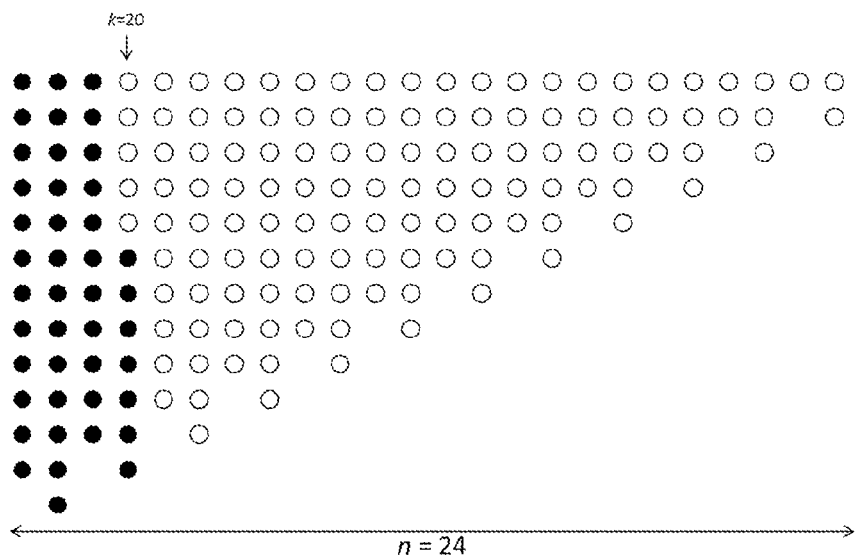
Figure 11 – Truncated example Booth array

METHOD AND APPARATUS FOR SYNTHESISING A SUM OF ADDENDS OPERATION AND AN INTEGRATED CIRCUIT

CROSS REFERENCE TO RELATED APPLICATIONS

This application claims priority from GB App. No. 1210982.3, filed on Jun. 20, 2012 and entitled "METHOD AND APPARATUS FOR SYNTHESISING A SUM OF ADDENDS OPERATION AND FOR MANUFACTURING AN INTEGRATED CIRCUIT", which is incorporated by reference in its entirety herein for all purposes.

BACKGROUND

1. Field

This invention relates to the synthesis of a functional block in logic of the type which can be used to perform a sum-of-addends operation, as commonly used for binary multiplication and to a method and apparatus for manufacturing an integrated circuit using the thus synthesised functional block.

2. Related Art

When modern integrated circuits (IC) designs are produced, these usually start with a high level design specification which captures the basic functionality required but does not include the detail of implementation. High level models of this type are usual written using high level programming language to derive some proof of concept and validate the model, and can be run on general purpose computers or on dedicated processing devices.

Once this has been completed and the model has been reduced to register transfer level (RTL) using commercially available tools, this RTL model can then be optimised to determine a preferred implementation of the design in silicon.

The implementation of some types of multiplier in hardware often involve the determination of a number of partial products which are then summed, each shifted by one bit relative to the previous partial product. Visually this can be considered as a parallelogram array of bits as shown in FIG. 1, where the black circles represent bits. The example of FIG. 1 shows the multiplication of four 4 bit numbers. The result of the multiplication is an 8 bit number.

FIG. 1 illustrates a straightforward multiplier but others can be implemented, such as Booth multipliers which will be discussed later in this specification. Some of these other multipliers do not arrange the bits in this parallelogram pattern. Nevertheless, they still have to perform a sum of addends in order to produce a result.

When such a multiplier is synthesised in RTL it produces a netlist of gates which can then be implemented in silicon. In many cases, the precision of the sum of addends required is lower than that provided by a full summation. Therefore, in some instances truncated multipliers are used which produced a less accurate result. A modified version of FIG. 1 is shown in FIG. 2. In this example the least significant whole k columns of bits are truncated (that is to say discarded) and to compensate for this a constant value represented by the hatched circles is added. Once the summation has been calculated, further truncation of the n-k least significant bits of the result can be performed to leave an approximation to the multiplication result. Thus, the truncation comprises the discarding of some of the columns and the adding of a constant to one or more of the remaining columns to provide the approximation to the multiplication results. Synthesis of such an arrangement in RTL will result in a smaller netlist and therefore will enable a multiplier to be manufactured using fewer gates and thus less silicon. This will reduce the cost.

The issue with truncating bits in sum of products operations is that it is complex to determine the effect of truncation and usually error statistics need to be gathered which is time consuming and can lead to many iterations being required during RTL synthesis to produce just one sum of addends unit. This problem becomes much worse with larger multipliers than those shown in the examples of FIGS. 1 and 2. Further complexity may arise when many separate multiplications are combined together and summed with a larger array as is shown in FIG. 3. This shows four separate multiplications x1*y1 to x4*y4 which are all combined in a single summation array. Each one of these multiplications can be truncated by different numbers of columns (k). This significantly further increases complexity in determining the effects of truncation on any error in the thus approximated result. The larger the sum of addends and the more multiplications which are combined the more the complexity rises.

It is therefore desirable to be able to construct a sum of addends function which minimises hardware implementation cost as the output of RTL synthesis while maintaining a known error profile. In other words, it will be desirable to reduce the complexity of the synthesised logic as much as possible through truncation while maintaining a known error in the thus approximated result, without the time consuming data manipulation required to gather error statistics. Any reduction in complexity results in a reduction in silicon area and hence also in costs and power consumption.

SUMMARY

In a first aspect there is provided a method for deriving in RTL a logic circuit for performing a sum of addends operation with faithful rounding comprising:
a) determining a number of bits to discard from a result of the sum of addends to produce a faithfully rounded result;
b) determining a value of bits which may be discarded prior to performing the sum of addends operation and a constant to include in the sum of addends operation;
c) determining how many least significant whole columns of bits may be discarded from the sum of addends operation;
d) discarding those said columns;
e) determining how many bits of a next least significant column can be discarded from the sum of addends operation;
f) discarding those said bits from said next least significant column; and
g) deriving an RTL representation of the sum of addends operation without said discarded columns and bits, and including said constant.

In accordance with a second aspect there is provided a method for manufacturing in integrated circuit for performing a sum of addends operation with faithful rounding comprising:
a) determining a number of bits to discard from a result of the sum of addends to produce a faithfully rounded result;
b) determining a value of bits which may be discarded prior to performing the sum of addends operation and a constant to include in the sum of addends operation to produce a faithfully rounded result;
c) determining how many least significant whole columns of bits may be discarded from the sum of addends operation;
d) discarding those said columns;
e) determining how many bits of a next least significant column can be discarded from the sum of addends operation;
f) discarding those said bits from said next least significant column;

g) deriving an RTL representation of the sum of addends operation without said discarded columns and bits, and including said constant; and h) manufacturing the integrated circuit with the thus derived RTL representation of the sum of addends operation.

In accordance with a third aspect there is provided an integrated circuit for performing multiplication of input logic values to a predetermined faithful rounding precision comprising:

an input to receive logic values;

a logic gate array to perform multiplication of the input logic values and for providing an output value to the predetermined faithful rounding precision:

wherein the logic gate array is configured to perform a sum of addends representing the multiplication, the sum of addends including columns of lower significance than the predetermined faithful rounding precision and wherein the logic gate array is further configured to sum only some of the bits of a least significant column of the said columns of lower significance.

In accordance with a fourth aspect there is provided a computer program product which when run on a computing system causes it to perform a method for deriving in RTL a logic circuit for performing a sum of addends operating with faithful rounding comprising:

a) determining a number of bits to discard from a result of the sum of addends to produce a faithfully rounded result;

b) determining a value of bits which may be discarded prior to performing the sum of addends operation and a constant to include in the sum of addends operation;

c) determining how many least significant whole columns of bits may be discarded from the sum of addends operation;

d) discarding those said columns;

e) determining how many bits of a next least significant column can be discarded from the sum of addends operation;

f) discarding those said bits from said next least significant column; and g) deriving an RTL representative of the sum of addends operation without said discarded columns and bits, and including said constant.

Further aspects include manufacturing circuitry based on the RTL representations produced according to the above-described methods, and the resulting circuitry. Such circuitry may be contained in an integrated circuit with other circuitry, and further aspects include integrate circuits embodying the circuits fabricated according to an RTL representation according to the disclosure. Still further aspects include hardware description language descriptions of circuitry produced according to methods embodying aspects of the disclosure.

BRIEF DESCRIPTION OF THE DRAWINGS

FIG. 1 shows an example summation of four 4 bit partial products as referred to above;

FIG. 2 shows an example of a multiplier of the form of FIG. 1 with truncation applied;

FIG. 3 shows an example of combined truncated multipliers as discussed above;

FIG. 4 shows the relationship of faithfully rounded results from a sum of addends in relation to a precise result;

FIG. 5 shows an example of truncation and notation used in accordance with the embodiment of the invention;

FIG. 6 shows a rearrangement of the array of FIG. 5;

FIG. 7 shows an example of truncation of optimal bits from an arbitrary array in accordance with an embodiment of the invention;

FIG. 8 shows an example 24 bit multiplication array;

FIG. 9 shows a truncated example 24 bit multiplier array in accordance with an embodiment of the invention;

FIG. 10 shows an example Booth multiplier array to which the invention may be applied;

FIG. 11 shows a truncated example of the Booth multiplier array of FIG. 10 in accordance with an embodiment of the invention;

DETAILED DESCRIPTION

Figure 12:
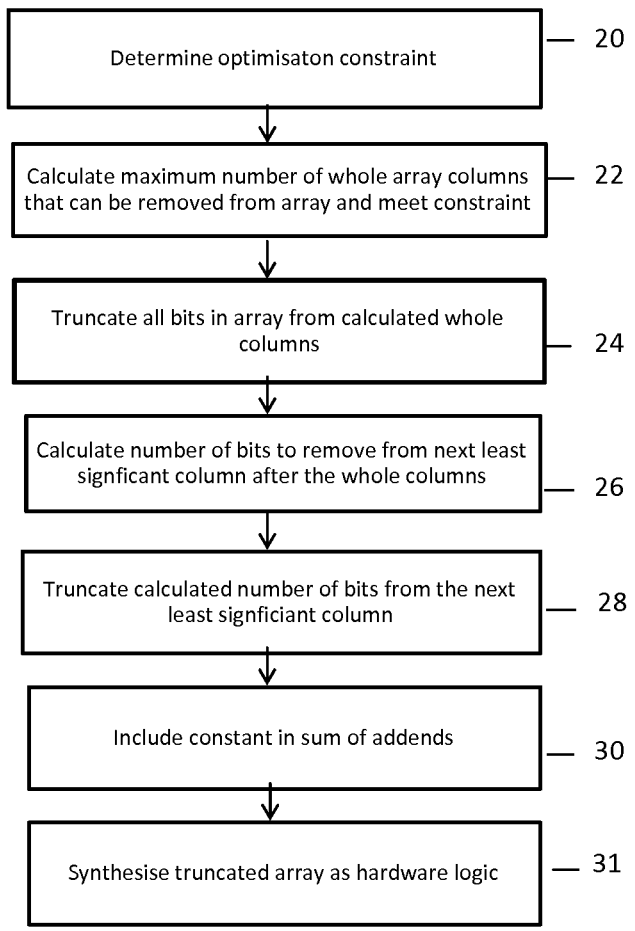
FIG. 12 shows a flow diagram of an embodiment of the invention.

Embodiments described below aim to truncate a bit array to which a sum of addends is to be applied and which represents a multiplication such that it generates a faithful rounding of the real precise result. In other words, the faithful rounding limits provide a known error profile.

As those skilled in the art will be aware a faithfully rounded result is a machine representable number that is either immediately above or immediate below the real precise result. This is shown in FIG. 4. As can be seen, the machine representable values are indicated with dash lines. A valid faithful rounding can be the machine representable value either side of the precise result, although one value may be closer than the other. The exception to this arises when the precise result can be represented exactly by a machine value, in which case only that exact machine value is valid. In other words, the faithfully rounded value will be spaced from the real precise value by less than the spacing between machine representable numbers As is well known, when implemented in an IC faithful rounding schemes typically use less silicon area than other rounding schemes such as round to nearest, or round to zero. Therefore, they give a preferential reduction in silicon and consequently in cost and power consumption.

The following describes a technique for determining how many bits can be truncated from an array before summing the values, and which columns they should be removed from, such that the achieved result is still a faithful rounding of the real value. The following notation is used:

F is the precise result $\Delta$ is the set of bits to truncate (i.e. throw away) from the array $val(\Delta)$ is the value of the bits within the set $\Delta$ C is the compensating constant added to the array n is the number of least significant bits (columns) that are removed from the precise result to give the faithfully rounded approximate result F' is the approximate result This notation is indicated graphically using the example of FIG. 3, a shown below in FIG. 5. In the following, it is assumed that any bit within the array can take the value of one independently of any other bit in the array. Using this notation, the approximation to the precise result can be given by the following floor function:

$$F' = 2^n \left\lfloor \frac{F - val(\Delta) + C}{2^n} \right\rfloor$$

The numerator $F-\text{val}(\Delta)+C$ gives the value of the real result minus the truncated bit value, plus the constant, and the floor function $2^n \lfloor \cdot /2^n \rfloor$ removes the n least significant bits. The error in this approximation is therefore:

$$\varepsilon = F - F'$$
$$\varepsilon = F - 2^n \left\lfloor \frac{F - \text{val}(\Delta) + C}{2^n} \right\rfloor$$
$$\varepsilon = (F - \text{val}(\Delta) + C) \bmod 2^n + \text{val}(\Delta) - C$$

The last step in the equations above uses a known rearrangement of the floor function. The error in the approximation can then be defined within limits as:

$$-C \leq \varepsilon \leq 2^n - 1 + \text{val}(\Delta) - C$$

This is because the smallest the error value can be is $-C$ (in the case that the first part of the error equation is divisible by $2^n$ and $\text{val}(\Delta)$ is zero, and the largest that the error value can be is $2^n - 1 + \text{val}(\Delta) - C$ (as $2^n - 1$ is the largest possible value from the modulo operation).

As noted above, faithful rounding requires that the approximate value varies from the precise result by less than the spacing between machine representable values. In this case, the least significant n bits are being removed from the precise result, and hence the spacing between machine representable values is $2^n$. Therefore, to ensure faithful rounding, the magnitude of the error must be less than $2^n$, i.e. $|\varepsilon| < 2^n$. Any error larger than this will not give a faithfully rounded result.

Considering the bounds of the error, this means that $C < 2^n$ (from the lower bound) and $2^n - 1 + \text{val}(\Delta) - C < 2^n$ (from the upper bound). If C is set to its maximal possible value of $C = 2^n - 1$, then this places the least restriction on $\Delta$. This value for C satisfies the lower bound, and means that $\text{val}(\Delta) < 2^n$ satisfies the upper bound. That is to say, C and the value of bits to be discarded by truncation must each be smaller than the difference between adjacent faithful rounding values in a selected faithful rounding scheme.

As a result of this, the optimisation task for the synthesis of the operation can be stated as maximising the number of bits in $\Delta$, subject to $\text{val}(\Delta) < 2^n$. In other words, the number of bits to truncate from the array should be maximised (to reduce silicon area and complexity), while keeping the value of the bits removed to less than $2^n$ to ensure that faithful rounding is maintained. Described below is a technique for achieving this optimisation task, where faithfully rounding is maintained and the number of bits discarded is maximised (leading to fewer gates and thus less silicon area being used).

To more clearly show the operation of the optimisation, the array can be represented as shown in FIG. 6. FIG. 6 shows the same array as in FIG. 5, except that the bits have been grouped together into contiguous columns. This does not affect the result of the array summation, as it is irrelevant which row a given bit is from, or indeed which row a bit is removed from (as a one at any bit position is independent of other bit positions). For illustration, the example of FIG. 6 also shows the same number of bits being removed from the array as FIG. 5 (as indicated by white circles), although this is not necessarily optimal (the determination of this is described in more detail below). These bits are the ones which were originally truncated as shown in FIG. 3.

The notation $h_i$ is used to denote the total number of bits in column i (i.e. the array height), and the notation $l_i$ is used to denote the number of bits to remove from column i.

Using this notation, the optimisation problem can be expressed as:

$$\text{Maximising the number of bits removed} \Rightarrow \max \sum_{i=k}^{n-1} l_i$$

$$\text{Such that } \text{val}(\Delta) < 2^n \Rightarrow \sum_{i=0}^{n-1} l_i 2^i < 2^n, \text{ where } l_i \leq h_i$$

A value k is now defined, and this is the largest number of complete (i.e. whole) least significant columns that can be removed from the array, such that the optimisation constraint $\text{val}(\Delta) < 2^n$ is maintained. This value is a key part of the determination of the optimal number of bits to truncate. This can be found from:

$$k = \max(r) \text{ such that } \sum_{i=0}^{r-1} h_i 2^i < 2^n$$

For example, in the merely illustrative case of FIG. 6, n is 5 so $2^n$ is 32, and $h_0=4$, $h_1=7$ and $h_2=4$. If $r=2$, then the sum of the first two column values is $4 \times 1 + 7 \times 2 = 18$ (which is less than 32). If $r=3$, then the sum of the first three column values is $4 \times 1 + 7 \times 2 + 4 \times 4 = 34$ (which is greater than 32). Therefore, only two full columns can be removed with the constraint of their value being $<2^n$, and hence $k=2$ in this example.

The truncation optimisation problem can be summarised by the following steps:
1. Calculate k
2. Remove all bits from all columns less than k
3. Do not remove any bits from any columns greater than k
4. Determine the maximum number of bits to remove from column k to meet the optimisation criteria Following these steps during RTL synthesis will optimise the number of bits which are removed.

The proof behind each of these steps is outlined below.

The optimal number of bits to remove from column i is denoted $l_i^{opt}$. If the removal of all columns less than k is optimal, then this given by the lemma:

$$l_i^{opt} = h_i \text{ for } i < k$$

This can be proven by contradiction using the following two cases:
a. If $i, opt=0$ for $i \geq k$ and there exists $j < k$ such that $l_j^{opt} < h_j$ then, by the definition of k, $l_j$ can increase to $h_j$ thus increasing the objective of maximising the number of bits to remove while not violating the constraint.
b. If there exists $i \geq k$ and $l_i^{opt} < 0$ and $j < k$ with $l_j^{opt} < h_j$ then $l_i^{opt}$ can be decremented and $l_j^{opt}$ incremented. The objective is unchanged (still the same number of bits removed) and the constraint is still met as the left hand side of the constraint is reduced by $2^i - w^j > 0$.

This means that that if there exists a supposedly optimal set of values for $l_i$ such that $l_i^{opt} < h_i$ for some $i < k$, then by repeated application of the second case, truncations in column k or above can be exchanged for truncations in the least significant k columns. If all the truncations occur in the least significant k columns then these can include all partial product bits of the k columns, by the definition of k. Hence it can be assumed that optimal $l_i$ values satisfy $l_i^{opt} = h_i$ for $i < k$. In other words, it is optimal to remove all bits from columns less than k.

This result can be substituted into the optimisation of RTL synthesis, as follows:

$$\text{Maximising the number of bits removed} \Rightarrow \max \sum_{i=0}^{n-1} l_i + \sum_{i=0}^{k-1} h_i$$

$$\text{Such that } val(\Delta) < 2^n \Rightarrow \sum_{i=0}^{n-1} l_i 2^i + \sum_{i=0}^{k-1} h_i 2^i < 2^n, \text{ where } l_i \le h_i$$

Because $$\sum_{i=0}^{k-1} h_i$$

is a constant, this can be removed from the maximisation. The constraint can also be rearranged, and this gives the following optimisation problem:

$$\text{Maximising the number of bits removed} \Rightarrow \max \sum_{i=k}^{n-1} l_i$$

$$\text{Such that } val(\Delta) < 2^n \Rightarrow \sum_{i=0}^{n-k-1} l_{k+i} 2^i < \frac{2^n - \sum_{i=0}^{k-1} h_i 2^i}{2^k},$$

where $l_i \le h_i$

This optimisation problem can be clarified by using the definition of k (that k is the column just before the value is $\ge 2^n$):

$$\sum_{i=0}^{k-1} h_i 2^i < 2^n \le \sum_{i=0}^{k} h_i 2^i$$

This can be rearranged as follows:

$$0 < 2^n - \sum_{i=0}^{k-1} h_i 2^i \le h_k 2^k$$

$$0 < 2^{n-k} - \sum_{i=0}^{k-1} h_i 2^{i-k} \le h_k$$

This can be substituted into the optimisation problem to give:

$$\text{Maximising the number of bits removed} \Rightarrow \max \sum_{i=k}^{n-1} l_i$$

$$\text{Such that } val(\Delta) < 2^n \Rightarrow \sum_{i=0}^{n-k-1} l_{k+i} 2^i < 2^{n-k} - \sum_{i=0}^{k-1} h_i 2^{i-k} \le h_k,$$

where $l_i \le h_i$

Moving onto step 3 of the optimisation, if the removal of no bits from columns greater than k is optimal, then this given by the lemma:

$l_i^{opt} = 0$ for $i > k$

By contradiction, say there exists $j > k$ such that $l_j^{opt} > 0$, then that implies that the constraint term contains terms of the following form:

$$\ldots + l_j 2^{j-k} + l_k < 2^{n-k} - \sum_{i=0}^{k-1} h_i 2^{i-k} \le h_k$$

If these transformations are made:

$l_j \to l_j - 1$ $l_k \to l_k + 2^{j-k}$

Then the objective function is strictly increased, and the constraint function is unchanged. Note that the new $l_k$ still satisfies $l_k \le h_k$ because it is already known that $l_j 2^{j-k} + l_k < h_k$. It can therefore be concluded that $l_i^{opt} = 0$ for $i > k$. In other words, it is optimal not to remove any bits from columns greater than k. This lemma shows that if there is a set of supposedly optimal values for $l_i$ which have truncations in a column above k then these can be exchanged for more truncations in column k.

By including $l_i^{opt} = 0$ for $i > k$ in the optimisation problem, this can be further simplified as follows:

$$\text{Maximising the number of bits removed} \Rightarrow \max l_k$$

$$\text{Such that } val(\Delta) < 2^n \Rightarrow l_k < 2^{n-k} - \sum_{i=0}^{k-1} h_i 2^{i-k} \le h_k,$$

where $l_i \le h_i$

It can be noted that this now depends only on the number of bits to remove from the $k^{th}$ column (remembering that columns are indexed from zero). The solution satisfying this optimisation problem is therefore:

$$l_k^{opt} = \left\lceil 2^{n-k} - 1 - \sum_{i=0}^{k-1} h_i 2^{i-k} \right\rceil$$

This means that the equation above can be used to determine the optimal number of bits to remove from column k of the array (step 4 in the process above). The overall process for determining the bits to truncate can then be stated in full as follows:

1. Determine k from k=max(r) such that $$\sum_{i=0}^{r-1} h_i 2^i < 2^n$$

2. Remove all bits from all columns less than k
3. Do not remove any bits from any columns greater than k
4. Determine the number of bits to remove from column k from $$l_k^{opt} = \left\lceil 2^{n-k} - 1 - \sum_{i=0}^{k-1} h_i 2^{i-k} \right\rceil$$

More formally, this can be expressed as:

$$l_i^{opt} = \begin{cases} h_i & i < k \\ \left\lceil 2^{n-k} - 1 - \sum_{j=0}^{k-1} h_j 2^{j-k} \right\rceil & i = k \\ 0 & i > k \end{cases}$$

$$\text{Where } k = \max\left(r: \sum_{i=0}^{r-1} h_i 2^i < 2^n\right)$$

Finally, in order to complete the optimisation within the faithfully rounded constraints, the constant C must be added, where $C=2^n-1$.

Using the example of the arbitrary array of FIG. 6, the optimal bits to remove can be calculated as follows. Above, k was calculated to be 2. Therefore, the bits from column 0 and 1 are removed, and no bits from column 3 and above are removed. The heights of the least significant three columns are {10, 7, 4} as shown in the Figure. $l_2^{opt}$ can then be calculated as $\lceil 2^5-2-1-(4\times0.25+7\times0.5)\rceil 1=3$. This result can be seen illustrated below in FIG. 7 in which bits are removed from column 2.

Two more illustrative examples are included below for different types of multipliers, which also show how the optimisation can be further simplified when particular known multiplier structures are used. FIG. 8 shows an example of a 24-bit multiplication operation using an AND array multiplier. The AND array multiplier forms the parallelogram type array as mentioned previously. In this example, the number of bits to be removed from the result, n, is 24.thus for a faithfully rounded result, the least significant 24 bits of FIG. 8 are removed from the result.

In the area of the array that is being truncated (i.e. ≤n) the array is a triangle, and hence the value for $h_i$ can be calculated simply by $h_i=i+1$. Substituting this in allows the optimisation algorithm to be further simplified, as follows:

$$l_i^{opt} = \begin{cases} i+1 & i < k \\ \left\lceil 2^{n-k} - 1 - \sum_{j=0}^{k-1} (j+1) 2^{j-k} \right\rceil & i = k \\ 0 & i > k \end{cases}$$

$$\text{Where } k = \max\left(r: \sum_{i=0}^{r-1} (i+1) 2^i < 2^n\right)$$

This can be reduced to:

$$l_i^{opt} = \begin{cases} i+1 & i < k \\ 2^{n-k} - k & i = k \\ 0 & i > k \end{cases}$$

Where $k=\max(r:(r-1)2^r<2^n)$

Applying this optimisation algorithm to the example of FIG. 8 for n=24, it is found that k=19 and $l_k=13$. This truncation is shown illustrated in FIG. 9, and shows that a significant number of the bits can be truncated, which significantly reduces silicon area in the synthesised hardware.

A second example multiplier is shown below in FIG. 10. This shows the n least significant columns of a Booth multiplier array (in this case a radix-2 Booth array), where n=24.

The Booth multiplier array has a different structure to the AND array. As this type of array has a specific structure, the relationship between heights of the columns and their location can be determined. For example, it can be found that the maximal value of of any least significant k columns of the array is given by:

$$\sum_{i=0}^{k-1} h_i 2^i = \left\lfloor \frac{k+1}{2} \right\rfloor 2^k$$

Substituting this into the optimisation problem gives:

$$l_i^{opt} = \begin{cases} h_i & i < k \\ \left\lceil 2^{n-k} - 1 - \left\lfloor \frac{k+1}{2} \right\rfloor \right\rceil & i = k \\ 0 & i > k \end{cases}$$

$$\text{Where } k = \max\left(r: \left\lfloor \frac{k+1}{2} \right\rfloor 2^r < 2^n\right)$$

This can be further simplified to give:

$$l_i^{opt} = \begin{cases} h_i & i < k \\ 2^{n-k} - 1 - \left\lfloor \frac{k+1}{2} \right\rfloor & i = k \\ 0 & i > k \end{cases}$$

Where $k = \max(r: (r+1)2^r < 2^{n+1})$

Apply this optimisation function to the example of FIG. 10, for n=24, results in k=20 and $l_k$=5. The resulting truncation is illustrated in FIG. 11. Again, this shows a significant reduction in the number of bits to sum, and thus a significant reduction in, the area of silicon required to implement the Booth multiplier with faithful rounding.

A flow diagram showing the steps required to produce the RTL synthesised hardware logic to manufacture an IC embodying the invention is shown in FIG. 12. In this, as a first step 20, the optimisation constraint for a desired faithful rounding accuracy, i.e. the value of bits which may be discarded and the constant to include in the sum of addends operation are derived in accordance with the methodology described above. Next at 22, the maximum number of whole columns which may discarded is derived. The value of the bits in these columns may be less than or equal to the maximum value of bits which may be discarded. These columns are then discarded at 24.

The number of bits which may be discarded from the next least significant column is then derived at 26. The number of bits will range from 0 to x−1, where x is the number of bits in that column. These bits are then truncated from that column at 28.

A constant of $2^n-1$ is then introduced into the least significant n columns of the array at 30.

Using the thus truncated sum of addends array, a netlist of hardware logic is then synthesised at 31, and is used for the manufacture of a logic circuit in an integrated circuit to perform the faithfully rounded sum of addends operation.

Figure 13:
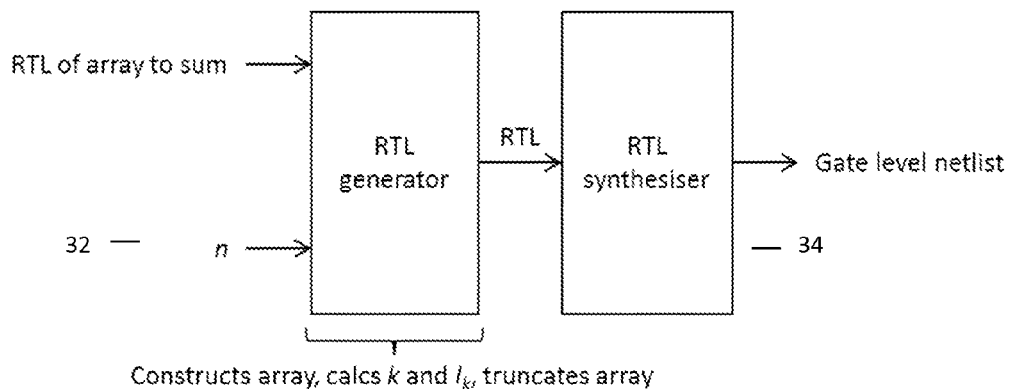
FIG. 13 shows schematically an RTL system to which the invention is applied.

FIG. 13 shows the system in which the method of FIG. 12 may be implemented. This comprises an RTL generator 32 which receives an RTL array to sum using a sum of addends operation, and a value n which is the number of bits to discard from the result to produce a faithfully rounded result. This generator 32 derives the maximum value of bits which may be discarded and the constant to include in the sum of addends operation, and using these derives the maximum number of whole columns to discard and the number of bits to discard from the next least significant column.

An RTL representation of the thus truncated array is then provided to RTL synthesiser 34 which uses known techniques to produce a gate level netlist to implement the sum of addends operation, and which is then used to manufacture a logic circuit in an IC to perform the truncated sum of addends.

Figure 14:
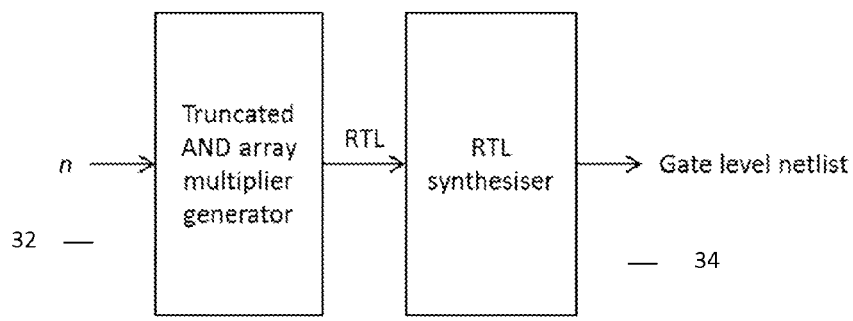
FIGS. 14 and 15 show the RTL synthesis units required for a truncated AND array and a truncated Booth array respectively of the types shown in FIGS. 9 and 11.
Figure 15:
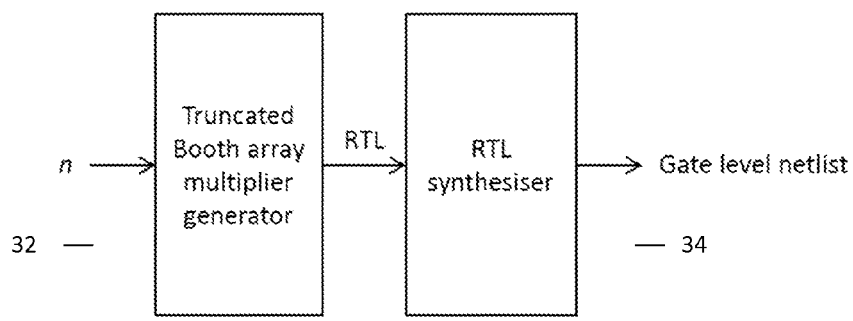

FIG. 14 and FIG. 15 show a modified versions of FIG. 12 for synthesising the logic required to implement the n bit AND array multiplier of FIGS. 9 and 11 respectively. In each of these cases, the form of the array on which the sum of addends is to be performed is known, and is dependent on the number of bits (n) in the multiplication. Where the multiplier is an n bit multiplier then when faithful rounding is applied the result should have the same number of bits, but be faithfully rounded to that number of bits. Thus, for 24 bits, as shown in FIG. 9, the faithfully rounded result has 24 bits and 24 bits are to be discarded from the sum of addends array by the RTL generator. The value of bits to be discarded can therefore be derived and the constant C, and from these the number of whole columns and any bits from the next significant column can be derived and thus discarded.

Using the methods and systems described above, faithfully rounded multiplier can be synthesised and manufactured using a sum of addends operation with truncation of whole columns and of a part of a next least significant column. The resultant circuitry will have reduced numbers of gates and will thus use less silicon and consume less power and be cheaper to both manufacture and operate. More specifically, such a multiplier will include logic gates to sum at least some of the columns of the sum of addends of lower significance than the faithful rounding precision, and sum only some of the bits of a least significant one of those columns.

RTL generation as performed in the RTL generators of FIGS. 12, 13 and 14 can also be implemented on a general purpose computer using known programming techniques to produce an appropriate software programme. The RTL generators may also be programmable generators embodied by hardware configured with software to perform the methodology described above may be loaded in accordance with the type of multiplier and faithful rounding scheme to be synthesised and manufactured.

One important distinction to note concerning faithfully rounded multipliers synthesised and manufactured as described above, is that the multiplications they perform are not always computable, i.e. a multiplied by b may give a different result to b multiplied by a. This difference arises because of the truncation, which may be different for the different orders of multiplication. It is important that this is understood when these multipliers are used.

The steps of the methods described herein may be carried out in any suitable order, or simultaneously where appropriate, unless constrained by the defined outputs of different steps. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (such as data and control messages) between elements.

Any reference to an item refers to one or more of those items, unless otherwise constrained by context. The term 'comprising' is used herein to mean including the method blocks or elements identified, but that such blocks or elements do not comprise an exclusive list and an apparatus may contain additional blocks or elements and a method may contain additional operations or elements.

Computer executable instructions (which when executed cause the processor to implement one or more steps from the methods described herein) may be provided using any computer-readable media that is accessible by the processor, such as a non-transitory medium. Computer-readable media may include, for example, computer storage media such as memory 1108 and communications media. Computer storage media, such as memory 1108, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include non-transitory communication media.

Aspects of functions, and methods described and/or claimed may be implemented in a special purpose or general-purpose computer including computer hardware, as discussed in greater detail below. Various functionality can be provided in customized FPGAs or ASICs or other configurable processors. Such processing functionality may be used in personal computers, desktop computers, laptop computers, message processors, hand-held devices, multi-processor systems, microprocessor-based or programmable consumer electronics, game consoles, network PCs, minicomputers, mainframe computers, mobile telephones, PDAs, tablets, embedded applications, such as televisions, automobiles, sensors, robots, and the like.

In addition to hardware embodiments (e.g., within or coupled to a Central Processing Unit ("CPU"), microprocessor, microcontroller, digital signal processor, processor core, System on Chip ("SOC"), or any other programmable or electronic device), implementations may also be embodied in software (e.g., computer readable code, program code, instructions and/or data disposed in any form, such as source, object or machine language) disposed, for example, in a computer usable (e.g., readable) medium configured to store the software. Such software can enable, for example, the function, fabrication, modeling, simulation, description, and/or testing of the apparatus and methods described herein. For example, this can be accomplished through the use of general programming languages (e.g., C, C++), GDSII databases, hardware description languages (HDL) including Verilog HDL, VHDL, SystemC Register Transfer Level (RTL) and so on, or other available programs, databases, and/or circuit (i.e., schematic) capture tools. Embodiments can be disposed in a machine usable medium including non-transitory memories such as memories using semiconductor, magnetic disk, optical disk, ferrous, resistive memory, flash memory, and so on. Such machine readable information can be accessed over networks from network attached storage, from storage area networks, from remote file servers, and so on.

As specific examples, it is understood that implementations of disclosed apparatuses and methods may be implemented in a semiconductor intellectual property core, such as a microprocessor core, or a portion thereof, embodied in a Hardware Description Language (HDL)), that can be used to produce a specific integrated circuit implementation. Examples of HDLs include Verilog HDL and VHSIC Hardware Description Language, where VHSIC stands for is Very High Speed Integrated Circuit. A computer readable medium may embody or store such description language data, and thus constitute an article of manufacture. A non-transitory machine readable medium is an example of computer readable media. Examples of other embodiments include computer readable media storing Register Transfer Language (RTL) description that may be adapted for use in a specific architecture or microarchitecture implementation. Additionally, the apparatus and methods described herein may be embodied as a combination of hardware and software that configures or programs hardware.

The invention claimed is:

1. A machine-implemented method for deriving an Register Transfer Language (RTL) representation of a logic circuit for performing a sum of addends operation with faithful rounding, comprising:
    a) determining, in a computing system, a number of bits to discard from a result of the sum of addends to produce a faithfully rounded result;
    b) determining, in the computing system, a value of bits which may be discarded prior to performing the sum of addends operation and a constant to include in the sum of addends operation;
    c) determining, in the computing system, how many least significant whole columns of bits may be discarded from the sum of addends operation;
    d) discarding, in the computing system, those said columns;
    e) determining, in the computing system, how many bits of a next least significant column can be discarded from the sum of addends operation;
    f) discarding, in the computing system, those said bits from said next least significant column; and
    g) deriving, in the computing system, an RTL representation of the sum of addends operation with said truncated columns and bits, and including said constant.

2. The method of claim 1, further comprising manufacturing an integrated circuit using the derived RTL representation of the sum of addends operation.

3. The machine-implemented method according to claim 1, in which the number of bits discarded in steps d) and f) is maximised.

4. The machine-implemented method according to claim 1 in which the sum of addends operation represents a multiplication.

5. The machine-implemented method according to claim 4 in which the multiplication comprises an AND array multiplication.

6. The machine-implemented method according to claim 4 in which the multiplication comprises a Booth multiplication.

7. The machine-implemented method of claim 1, further comprising producing a gate level netlist from the derived RTL representation and manufacturing an integrated circuit using the gate level netlist.

8. An integrated circuit for performing multiplication of values to a predetermined faithful rounding precision comprising:
    an input to receive values; and
    a logic gate array to perform multiplication of the values and for providing an output value to the predetermined faithful rounding precision,
    wherein the logic gate array is configured to perform a sum of addends representing the multiplication, the sum of addends including columns of lower significance than the predetermined faithful rounding precision and wherein the logic gate array is further configured to sum only some of the bits of a least significant column of the said columns of lower significance.

9. A non-transitory computer program product embodying data in a hardware description language representation, the data describing an integrated circuit for performing multiplication of values to a predetermined faithful rounding precision, the described integrated circuit comprising:
    an input to receive values;
    a logic gate array to perform multiplication of the values and for providing an output value to the predetermined faithful rounding precision,
    wherein the logic gate array is configured to perform a sum of addends representing the multiplication, the sum of addends including columns of lower significance than the predetermined faithful rounding precision and wherein the logic gate array is further configured to sum only some of the bits of a least significant column of the said columns of lower significance, wherein the data in the hardware description language representation is readable by a computer in order to produce a description of a specific integrated circuit realization of the integrated circuit described by the data in the hardware description language representation thereof.

10. The non-transitory computer program product of claim 9, wherein the hardware description language representation comprises a gate level netlist.

11. A non-transitory computer program product which when run on a computing system causes the computing system to perform a method for deriving an RTL representation of a logic circuit for performing a sum of addends operation with faithful rounding, the method comprising:
    a) determining a number of bits to discard from a result of the sum of addends to produce a faithfully rounded result;
    b) determining a value of bits which may be discarded prior to performing the sum of addends operation and a constant to include in the sum of addends operation;
    c) determining how many least significant whole columns of bits may be discarded from the sum of addends operation;
    d) discarding those said columns;
    e) determining how many bits of a next least significant column can be discarded from the sum of addends operation;
    f) discarding those said bits from said next least significant column; and
    g) deriving an RTL representation of the sum of addends operation without said discarded columns and bits, and including said constant.

12. A method used in producing an integrated circuit, comprising:
    providing a non-transitory machine readable medium for use by a computing system, on which is stored data representing a Register Transfer Language (RTL) representation of a logic circuit for performing a sum of addends operation with faithful rounding, the RTL representation of the logic circuit produced by a method comprising:

determining a number of bits to discard from a result of the sum of addends to produce a faithfully rounded result;

determining a value of bits which may be discarded prior to performing the sum of addends operation and a constant to include in the sum of addends operation;

determining how many least significant whole columns of bits may be discarded from the sum of addends operation;

discarding those said columns;

determining how many bits of a next least significant column can be discarded from the sum of addends operation;

discarding those said bits from said next least significant column, wherein the derived RTL representation of the sum of addends operation does not include logic for said discarded columns and bits, and includes said constant; and producing in the computing system a hardware description language representation of the RTL representation, the hardware description language representation describing hardware comprising an input to receive values; and a logic gate array to perform multiplication of the values and for providing an output value to the predetermined faithful rounding precision, wherein the logic gate array is configured to perform a sum of addends representing the multiplication, the sum of addends including columns of lower significance than the predetermined faithful rounding precision and wherein the logic gate array is further configured to sum only some of the bits of a least significant column of the said columns of lower significance.

* * * * *